United States Patent [19]

Fushimoto

[11] Patent Number: 4,791,608

[45] Date of Patent: Dec. 13, 1988

[54] MEMORY CARD HAVING SHUTTER PROTECTED TERMINALS

[75] Inventor: Hideo Fushimoto, Kawasaki, Japan

[73] Assignee: Canon Kabushiki Kaisha, Tokyo, Japan

[21] Appl. No.: 80,233

[22] Filed: Jul. 28, 1987

Related U.S. Application Data

[63] Continuation of Ser. No. 566,554, Dec. 29, 1983, abandoned.

[30] Foreign Application Priority Data

Jan. 10, 1983 [JP] Japan ................................. 58-1200

[51] Int. Cl.⁴ .............................................. G11C 5/04
[52] U.S. Cl. ..................................... 365/52; 365/228;
174/52.4; 439/55; 439/137; 361/395
[58] Field of Search ....................... 365/52, 53, 63, 54,
365/226, 228, 229; 174/52 FP; 235/492;
361/395, 399, 415; 439/133, 135, 137, 55

[56] References Cited

U.S. PATENT DOCUMENTS

| | | | |
|---|---|---|---|
| 4,120,012 | 10/1978 | Saito | 360/133 |
| 4,149,027 | 4/1979 | Asher et al. | 339/42 |
| 4,409,471 | 10/1983 | Aigo | 235/492 |
| 4,477,134 | 10/1984 | Wright | 339/17 F |
| 4,488,190 | 12/1984 | Oishi et al. | 360/133 |
| 4,511,944 | 4/1985 | Bowers | 360/133 |
| 4,533,976 | 8/1985 | Suwa | 361/395 |

OTHER PUBLICATIONS

Davis, "Solid State Cartridge System", IBM Technical Disclosure Bulletin, vol. 23, No. 5, Oct. 1980, pp. 1748-1750.

Capousis et al, "Protective Container for Integrated Circuit Modules", IBM Technical Disclosure Bulletin, vol. 17, No. 10, Mar. 1975, pp. 2972-2973.

Primary Examiner—Stuart N. Hecker
Assistant Examiner—Glenn A. Gossage
Attorney, Agent, or Firm—Fitzpatrick, Cella, Harper & Scinto

[57] ABSTRACT

A memory card adapted to be removably loaded into electronic equipment comprises a printed circuit board having a memory element mounted thereon and a contact pattern for making an electrical connection with the electronic equipment, a case for accommodating the printed circuit board and having an opening at a position facing the contact pattern of the printed circuit board, and a shutter member for opening and closing the opening.

7 Claims, 3 Drawing Sheets

MEMORY CARD HAVING SHUTTER PROTECTED TERMINALS

This application is a continuation of application Ser. No. 566,554 filed Dec. 29, 1983, now abandoned.

BACKGROUND OF THE INVENTION

1. Field of the Invention

The present invention relates to a memory card which is removably loaded into electronic equipment to exchange a predetermined program and data with the electronic equipment.

2. Description of the Prior Art

A memory card contains a predetermined program or data and it is removably loaded into electronic equipment having a programming function.

In many cases, such a memory card includes not only a ROM (read-only memory) but also a RAM (random access memory) to allow an operator to store a newly developed program or new data by operating keys of the electronic equipment.

A battery that functions as a power source is contained in the memory card to back up the RAM so that the memory content of the RAM is maintained after the memory card is unloaded from the electronic equipment.

Thus, in such a memory card, a plurality of contact patterns for exchanging signals with the electronic equipment are exposed and the exposed contact patterns are readily contacted by a finger or other articles.

In addition, if a static electricity is applied to the exposed contact patterns of a memory card having a RAM, the information stored in the RAM may be destroyed.

SUMMARY OF THE INVENTION

It is an object of the present invention to provide a memory card which is free from influence of static electricity.

It is another object of the present invention to provide a memory card which prevents dust from entering an opening where contact patterns are exposed and attains a perfect electrical connection with electronic equipment.

It is other object of the present invention to provide a memory card having a shutter which is opened and closed by external actuation, at an opening where contact patterns to be electrically connected to electronic equipment are exposed.

The other objects of the present invention will be apparent from the detailed description of the preferred embodiments of the present invention.

BRIEF DESCRIPTION OF THE DRAWINGS

FIGS. 1 to 6 show one embodiment of the present invention in which,

FIGS. 1 and 2 are perspective views with a shutter closed and opened, respectively, FIGS. 3 and 4 are plan views with the shutter closed and opened, respectively, FIG. 5 is a sectional view taken along a line A—A in FIG. 1, FIG. 6 is a sectional view taken along a line B—B in FIG. 2, and FIGS. 7 and 8 are perspective views of another embodiment of the present invention with a shutter closed and opened, respectively.

DETAILED DESCRIPTION OF THE PREFERRED EMBODIMENTS

First Embodiment

FIGS. 1 to 6 show one embodiment of the present invention. A memory card 1 is of generally flat case shape in which a ROM and RAM (not shown) as memories and a battery (not shown) as a memory back-up are contained.

Figure 5:
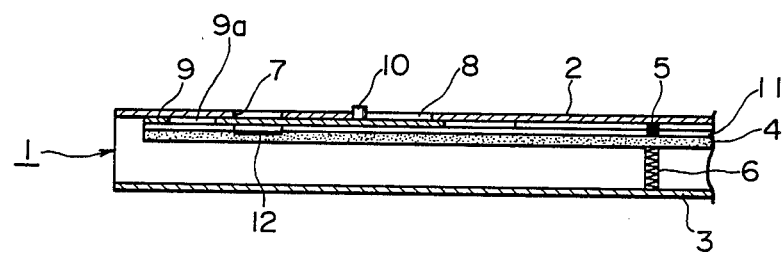
Figure 6:
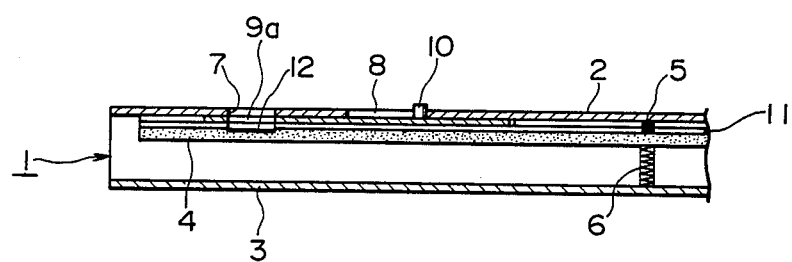

The memory card 1 has upper and lower plates 2 and 3 as shown in FIGS. 5 and 6, and a printed circuit board 4 having predetermined circuit patterns formed thereon and the ROM and the RAM soldered thereto is accommodated in the memory card 1.

A grounding pattern (not shown) formed on the printed circuit board 4 and the conductive plates 2 and 3 are connected through a grounding member 5 and a grounding spring 6.

An elongated rectangular opening 7 is formed near one longitudinal end of the plate 2 orthogonally to an axial direction, and a slot 8 is formed near the opening 7 on the axis of the plate 2.

As shown in FIGS. 5 and 6, a rectangular shutter 9 is slidably mounted under the plate 2. The shutter has an opening 9a having the same shape and size as the elongated opening 7 formed in the plate 2, and has a projection 10 formed thereon, which is slidably fitted to the slot 8 and extends to the exterior of the plate 2.

A spacer 11 for guiding the movement of the shutter 9 is arranged between the shutter 9 and the printed circuit board.

A contact pattern 12 which is connected to an electronic equipment at a position corresponding to the opening 7 of the plate 2 is formed on the printed circuit board 4.

The operation of the present embodiment is now explained.

Figure 1:
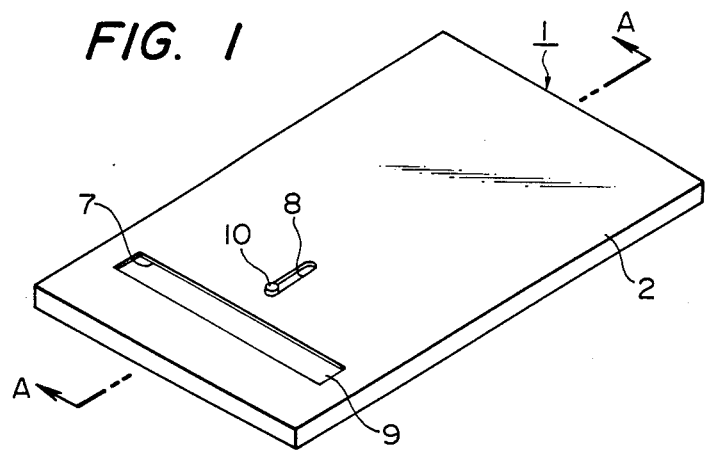
Figure 2:
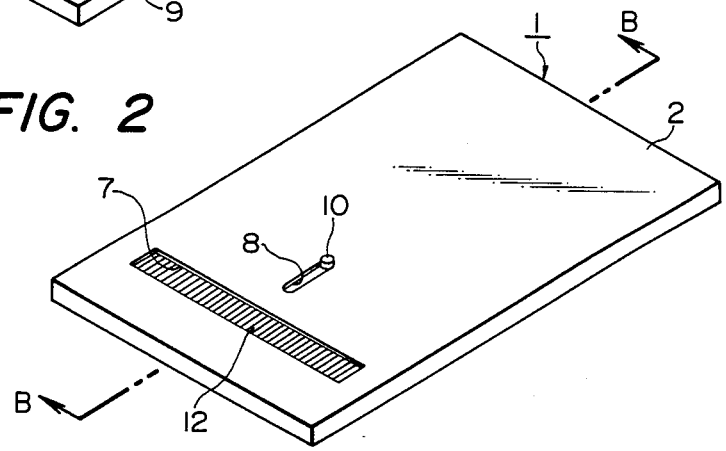
Figure 3:
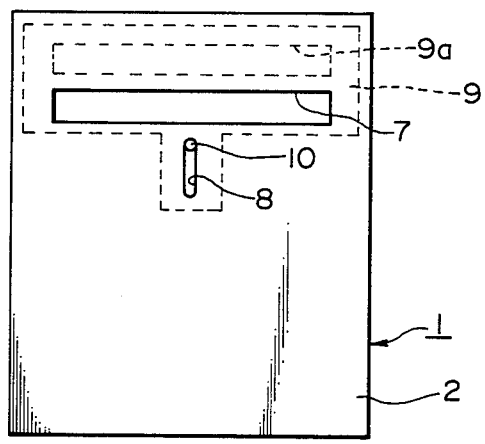

When the memory card is in a non-use status unloaded from the electronic equipment, the projection 10 is pushed by a finger tip and moved to the end of the slot 8 closer to the opening 7 so that the shutter 9 is moved to the opening 7 as shown by broken lines in FIG. 3 and the opening 9a formed in the shutter 9 is staggered from the opening 7 of the plate 2 and the opening 7 is closed by the shutter 9. Thus, the contact pattern 12 is not exposed from the opening 7 of the plate 2 of the memory card 1.

Accordingly, under this condition, even if the finger or an article is inserted into the opening 7 during the handling of the memory card 1, it is stopped by the shutter 9 and does not contact the contact pattern 12.

Since the shutter 9 is in contact with the plate 2, static electricity is conducted to the ground pattern of the printed circuit board through the plate 2 and the grounding member 5. Therefore, the memory elements are not destroyed and the entry of the foreign material from the opening 7 is prevented.

Figure 4:
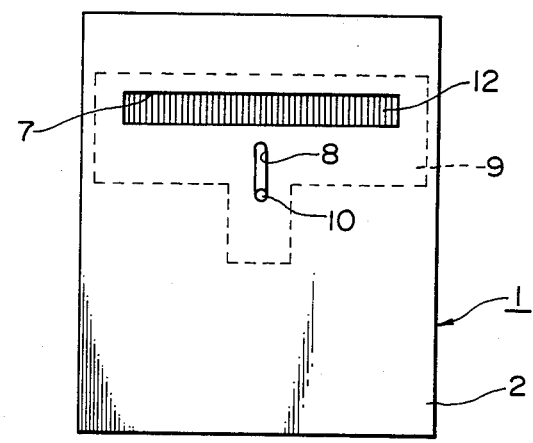

On the other hand, when the memory card is to be used in connection with the electronic equipment, the projection 10 is pushed by the finger and moved to the opposite end of the slot 8 as shown in FIG. 4 so that the opening 7 aligns to the opening 9a of the shutter 9 and the contact pattern 12 is exposed.

Under this condition, the memory card is connected to the electronic equipment so that the memory elements are connected to the contacts of the electronic equipment.

Second Embodiment

Figure 7:
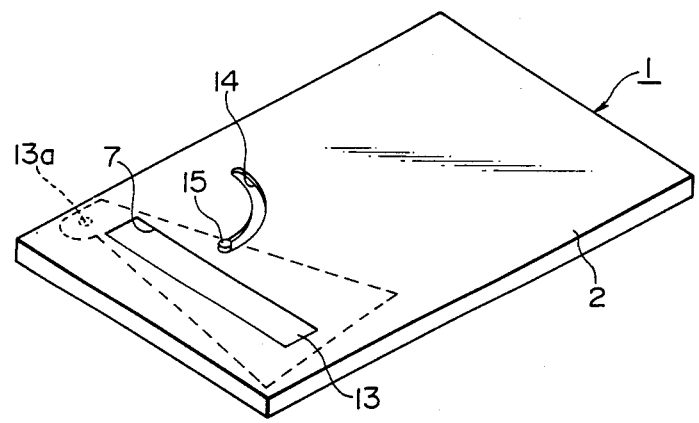
Figure 8:
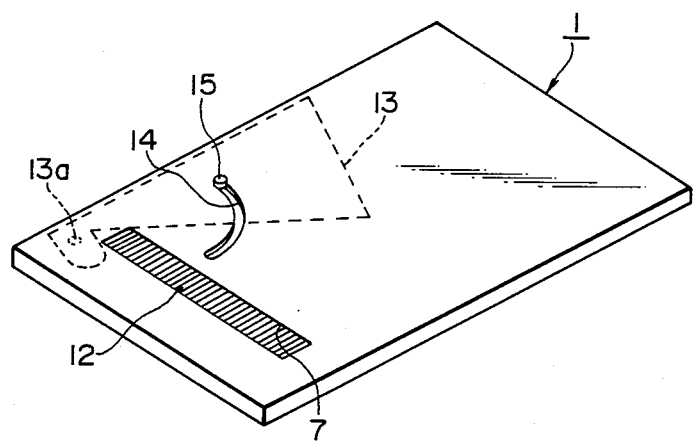

FIGS. 7 and 8 show another embodiment of the present invention, in which the like elements to those shown in FIGS. 1 to 6 are designated by the like numerals and the explanation thereof is omitted.

In the present embodiment, a sector-shaped shutter 13 is pivotably mounted by a pin 13a under the plate 2 of the memory card 1 and an arcuate guide hole 14 along a circumference centered at the pin 13a is formed near the opening 7, and a projection 15 formed on the shutter 13 is slidably fitted to the guide hole 14. The projection 15 is on the same circumference as that of the guide hole 14 formed on the circumference centered at the pin 13a.

Thus, by pushing the projection 15 by the finger and rotating the shutter 13, a position in which the opening 7 is closed as shown in FIG. 7 and a position in which the opening 7 is opened to expose the contact pattern 12 can be set and the same advantages as those of the first embodiment are attained.

I claim:

1. A memory card adapted to be removably loaded into electronic equipment, comprising:
   a contact pattern for exchanging information with an external equipment;
   an electrically conductive card-shaped case having an opening in a surface thereof at a position facing a position where said contact pattern is located;
   a shutter member for opening and closing said opening
   a memory element provided in said case and connected to said contact pattern for exchanging information with an external equipment;
   a printed circuit board provided in said case for making an electrical connection with said contact pattern and said memory element; and
   means provided in said case for making an electrical connection with said case and said printed circuit board to ground, static electricity being conducted to said printed circuit board through said case and said electrical connection means by closing said shutter member when said case is in a non-operative status unloaded from said external equipment, to prevent damage to said memory element due to said static electricity.

2. A memory card according to claim 1, further comprising a back-up battery for said memory means.

3. A memory card according to claim 1, wherein said shutter member has an opening of substantially the same shape and size as said opening in said case.

4. A memory card adapted to be removably loaded into electronic equipment, comprising:
   an electrically conductive card-shaped case having an opening;
   a contact member provided in said case at a position facing said opening for exchanging information with an external equipment, said contact member having a contact pattern for making an electrical connection with said electronic equipment and said case having an opening at a position facing said contact pattern;
   a shutter member for opening and closing said opening;
   a memory element provided in said case and connected to said contact member for exchanging information with an external equipment;
   a printed circuit board provived in said case for making an electrical connection with said contact member and said memory element; and
   means provided in said case for making an electrical connection with said case and said printed circuit board to ground, static electricity being conducted to said printed circuit board through said case and said electrical connection means by closing said shutter member when said case is in a non-operative status unloaded from said external equipment, to prevent damage to said memory element due to said static electricity.

5. A memory card according claim 4, further comprising shutter means slidably moving between said printed circuit board and said case for opening and closing said opening.

6. A memory card according to claim 5, further comprising a spacer arranged between said shutter means and said printed circuit board for guiding the movement of said shutter means.

7. A memory card according to claim 5, wherein said shutter means has an opening of substantially the same shape and size as said opening in said case.

* * * * *

UNITED STATES PATENT AND TRADEMARK OFFICE
CERTIFICATE OF CORRECTION

PATENT NO. : 4,791,608

DATED : December 13, 1988

INVENTOR(S) : HIDEO FUSHIMOTO

It is certified that error appears in the above-identified patent and that said Letters Patent is hereby corrected as shown below:

COLUMN 1

Line 46, "other" should read --another--.

COLUMN 3

Line 33, "ing" should read --ing;--.

COLUMN 4

Line 24, "provived" should read --provided--.

Signed and Sealed this

Twenty-sixth Day of December, 1989

Attest:

JEFFREY M. SAMUELS

*Attesting Officer*    *Acting Commissioner of Patents and Trademarks*